(12) United States Patent
Wu et al.

(10) Patent No.: US 9,455,346 B2
(45) Date of Patent: Sep. 27, 2016

(54) CHANNEL STRAIN INDUCING ARCHITECTURE AND DOPING TECHNIQUE AT REPLACEMENT POLY GATE (RPG) STAGE

(71) Applicant: Taiwan Semiconductor Manufacturing Co., Ltd., Hsin-Chu (TW)

(72) Inventors: Zhiqiang Wu, Chubei (TW); Yi-Ming Sheu, Hsinchu (TW); Tzer-Min Shen, Hsinchu (TW); Chun-Fu Cheng, Zhubei (TW); Hong-Shen Chen, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 134 days.

(21) Appl. No.: 14/100,263

(22) Filed: Dec. 9, 2013

(65) Prior Publication Data
US 2015/0162445 A1    Jun. 11, 2015

(51) Int. Cl.
*H01L 29/78*  (2006.01)
*H01L 29/66*  (2006.01)
*H01L 29/06*  (2006.01)
*H01L 29/10*  (2006.01)

(52) U.S. Cl.
CPC ....... *H01L 29/7848* (2013.01); *H01L 29/0615* (2013.01); *H01L 29/1054* (2013.01); *H01L 29/66545* (2013.01); *H01L 29/66795* (2013.01); *H01L 29/785* (2013.01); *H01L 29/7833* (2013.01)

(58) Field of Classification Search
None
See application file for complete search history.

(56) References Cited

U.S. PATENT DOCUMENTS

| | | | |
|---|---|---|---|
| 6,033,963 A | 3/2000 | Huang et al. | |
| 8,647,937 B2* | 2/2014 | Toh | H01L 29/66545 438/183 |
| 2005/0233525 A1 | 10/2005 | Yeo et al. | |
| 2011/0024804 A1 | 2/2011 | Chang et al. | |
| 2011/0031538 A1 | 2/2011 | Hsieh et al. | |
| 2012/0104509 A1* | 5/2012 | Matsumoto | H01L 21/823814 257/369 |
| 2012/0261754 A1* | 10/2012 | Cheng | H01L 29/66772 257/347 |
| 2013/0078772 A1 | 3/2013 | Yuan et al. | |
| 2013/0082275 A1* | 4/2013 | Dube | H01L 21/823814 257/369 |

* cited by examiner

*Primary Examiner* — Robert Carpenter
(74) *Attorney, Agent, or Firm* — Eschweiler & Associates, LLC

(57) ABSTRACT

The demand for increased performance and shrinking geometry from ICs has brought the introduction of multi-gate devices including finFET devices. Inducing a higher tensile strain/stress in a region provides for enhanced electron mobility, which may improve performance. High temperature processes during device fabrication tend to relax the stress on these strain inducing layers. The present disclosure relates to a method of forming a strain inducing layer or cap layer at the RPG (replacement poly silicon gate) stage of a finFET device formation process. In some embodiments, the strain inducing layer is doped to reduce the external resistance.

20 Claims, 13 Drawing Sheets

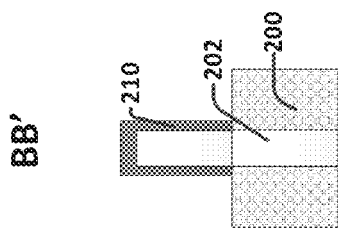
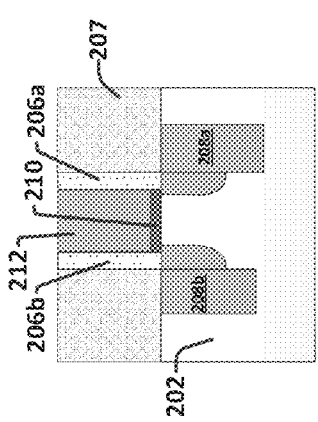
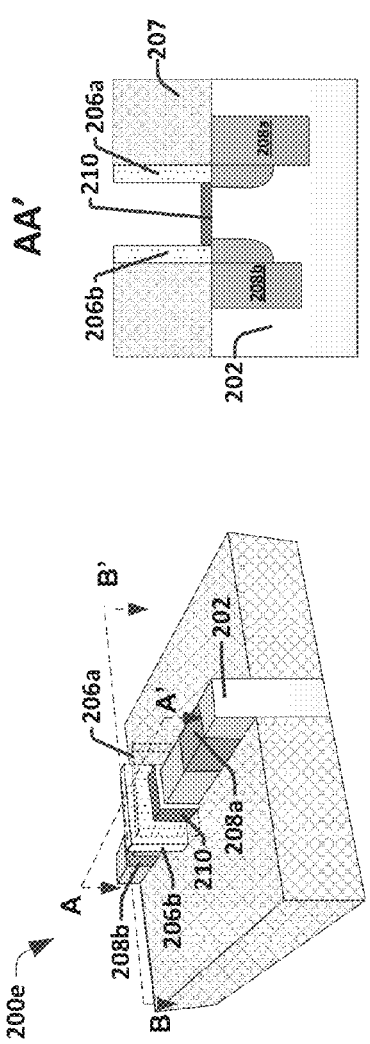
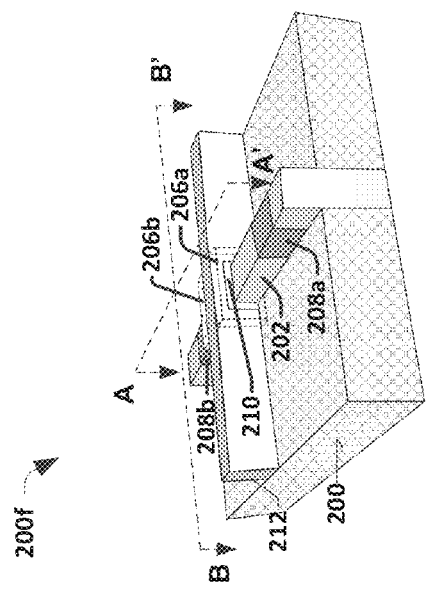
FIG. 2E
FIG. 2F

CHANNEL STRAIN INDUCING ARCHITECTURE AND DOPING TECHNIQUE AT REPLACEMENT POLY GATE (RPG) STAGE

BACKGROUND

With the scaling of integrated circuits, more devices are put into a chip. This not only requires the shrinkage of the device size, but it also requires an improvement in the manufacturing techniques. Fin field-effect transistors (Fin FETs) have increased drive currents and hence faster switching speed over planar transistors. As devices continue to get smaller, precise control of gate lengths also becomes critical to assure performance. Strain engineering is employed in semiconductor manufacturing to enhance device performance. Performance benefits are achieved by modulating strain in the transistor channel, which enhances electron mobility (or hole mobility) and thereby conductivity through the channel.

BRIEF DESCRIPTION OF THE DRAWINGS

FIGS. 2a-2f illustrate 3-dimensional images of some embodiments of the present disclosure and their corresponding cross sections along two perpendicular directions.

DETAILED DESCRIPTION

Figure 1:
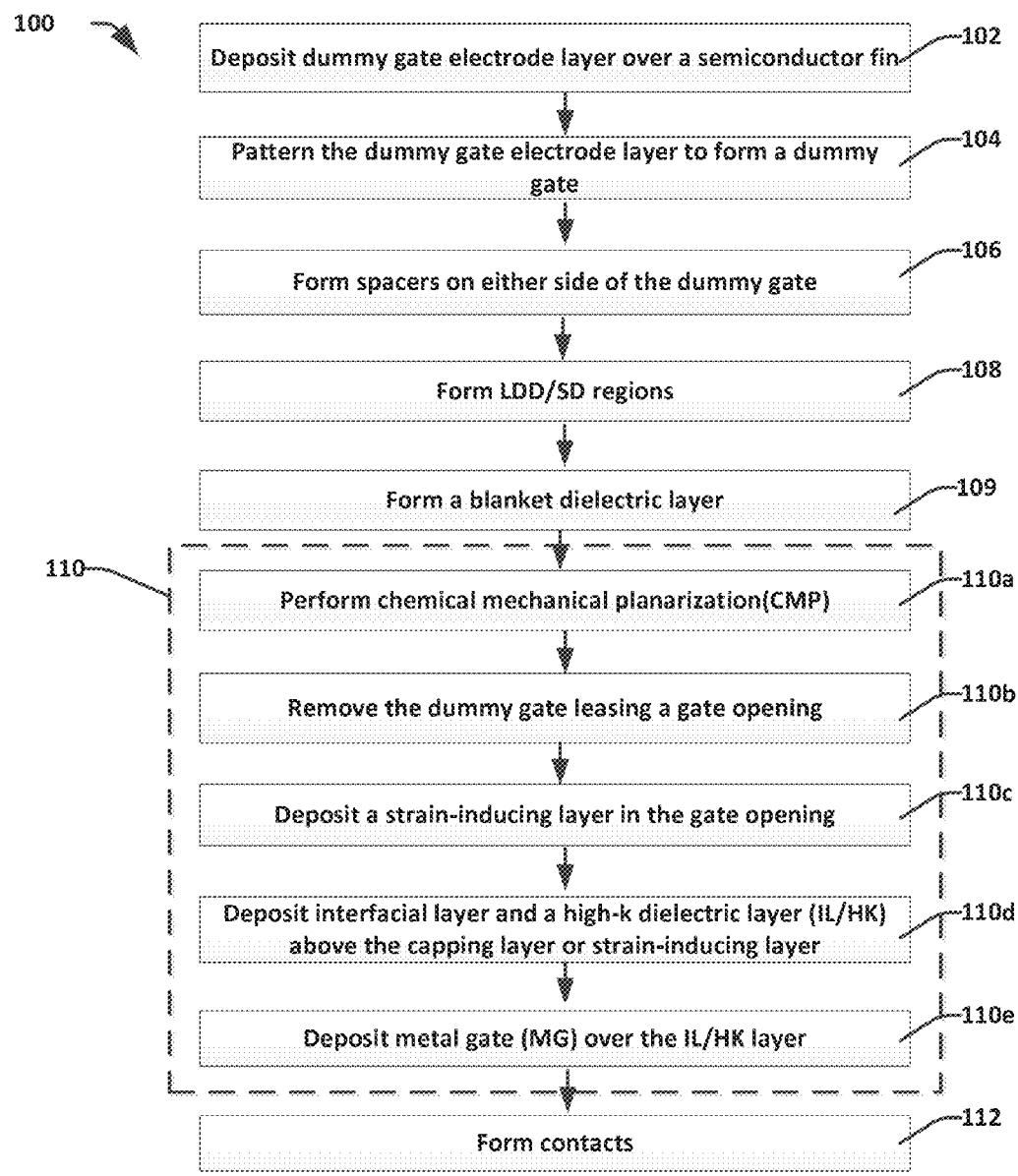
FIG. 1 illustrates a flow diagram of some embodiments of a method for forming a strain-inducing layer over a transistor channel at a replacement poly-silicon gate (RPG) stage of a fin field-effect transistor (finFET) formation process.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Strain engineering is employed in semiconductor manufacturing to enhance device performance. Strained silicon is a layer of silicon in which the silicon atoms are stretched beyond their normal inter atomic distance. This can be accomplished by putting the layer of silicon over a substrate of silicon germanium (SiGe), for example. As the atoms in the silicon layer align with the atoms of the underlying silicon germanium layer, which are arranged farther apart with respect to those of a bulk silicon crystal, the links between the silicon atoms become stretched thereby leading to strained silicon. At the atomic level, it is easier for carriers to pass through on appropriately strained lattice compared to an unstrained lattice, leading to faster switching times for transistor.

In CMOS technologies, PMOS and NMOS respond differently to different types of strain. Specifically, PMOS performance is best served by applying compressive strain to the channel, whereas NMOS receives benefit from tensile strain. SiGe ($Si_{1-x}Ge_x$), consisting of any molar ratio of silicon and germanium, is commonly used as a semiconductor material in integrated circuits (ICs) as a strain-inducing layer for strained silicon in CMOS transistors. The larger lattice constant of the SiGe film provides uniaxial strain to the Si channel. The higher the Ge concentration, the larger the strain and thus better performance. However, sequential processes and thermal steps during the formation of a field effect transistor tend to relax the stress of the strain-inducing layer and constrain upper limit of Ge concentration. Doping the SiGe strain-inducing or cap layer is not a flexible option to boost the device performance.

Accordingly, the present disclosure relates to a method of forming a SiGe strain-inducing layer or cap layer at a later stage of formation of a fin field effect transistor (finFET) device, specifically at a replacement polysilicon gate (RPG) stage of an RPG process, so that a higher Ge concentration can be utilized which leads to better carrier confinement and greater doping flexibility. An RPG process helps in controlling gate length and preventing metal migration during elevated temperature operations. In an RPG process, a dummy gate is formed of silicon dioxide or a polymer such as photoresist. After the high temperature processes involved in device formation are completed, the dummy gate is removed leaving a gate opening and the desired gate material is deposited in to the gate opening.

FIG. 1 illustrates a flow diagram of some embodiments of a method 100 for forming a strain-inducing layer over a transistor channel at a replacement poly-silicon gate (RPG) stage of a fin field-effect transistor (finFET) formation process.

While disclosed method 100 (and other methods described herein) is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 102, a dummy gate electrode layer is formed over a semiconductor fin. In some embodiments, the dummy gate electrode layer is composed of poly silicon having a thickness ranging from approximately 100 nm to 300 nm.

At 104, the dummy gate electrode layer is patterned using photolithography and anisotropically etched to form a dummy gate having sidewalls.

At 106, spacers are formed on either side of the dummy gate. In some embodiments, the spacers are preferably composed of silicon dioxide ($SiO_2$), silicon oxynitride ($Si_xO_yN_z$), composite ($SiO_2/Si_3N_4$), or most preferably silicon nitride ($Si_3N_4$). They can be formed by a blanket deposition and isotropic etch back. The spacers preferably have a thickness ranging between 1 nm and 5 nm.

At 108, impurity ions are implanted into the fin structure to form highly doped source and drain regions and/or lightly doped source and drain extensions using the dummy gate as an implant mask.

At 109, a blanket dielectric layer is formed over the dummy gate and the substrate structure.

Reference numeral 110 represents some embodiments of the replacement gate stage of the RPG process.

At 110a, the blanket dielectric layer is planarized using a chemical mechanical polishing (CMP) process.

At 110b, the dummy gate is removed, thereby forming a gate opening.

At 110c, a strain-inducing layer is deposited in the gate opening covering the channel. In some embodiments, the strain-inducing layer comprises SiGe.

At 110d, an interfacial layer and a high-k dielectric are deposited over the strain-inducing layer or capping layer.

At 110e, metal gate electrode layer is formed in the gate opening. The gate electrode layer is planarized to form a metal gate, stopping on the blanket dielectric layer.

At 112 metal contacts are formed at the desired positions over the device. In some embodiments contacts are formed at the source and drain regions by patterning the blanket dielectric layer to form contact openings and filling the contact openings with conductive plugs. The conductive plugs are preferably composed of tungsten. A metal layer is formed over the blanket dielectric layer and the conductive plugs and patterned to form device interconnections.

FIGS. 2a-2e illustrate 3-dimensional (3D) images of some embodiments of the present disclosure and their corresponding cross sections along two perpendicular directions.

Figure 2A:
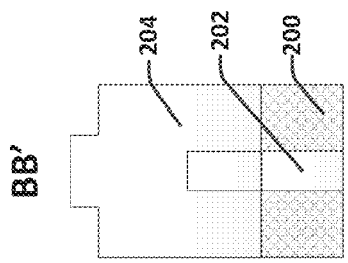
Figure 2A:
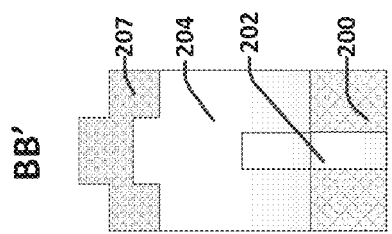
Figure 2A:
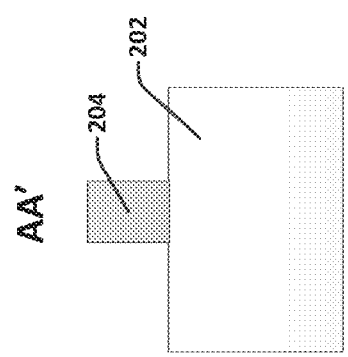
Figure 2A:
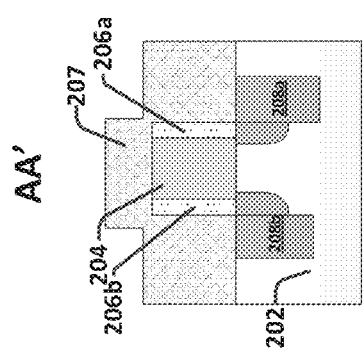
Figure 2A:
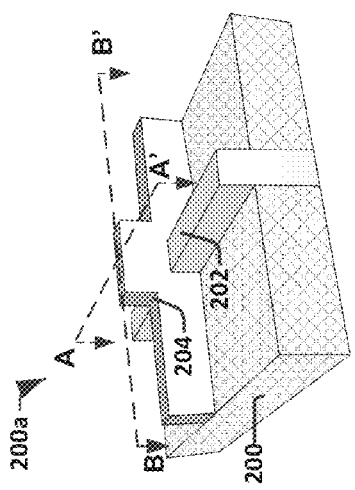

FIG. 2a illustrates a 3D view 200a of an embodiment of a finFET device comprising a dummy gate over a semiconductor fin. A semiconductor body 200 has a semiconductor fin 202 disposed along a first direction. The semiconductor body 200 comprises alternating zones of active regions (for e.g. silicon) and isolation regions (for e.g. oxide). A dummy gate 204 comprising polysilicon is disposed in a second direction (which is perpendicular to the first direction) over the semiconductor fin 202 at a location that is approximately the midpoint of the fin 202. In some embodiments a dummy gate oxide layer (not shown) is deposited along the second direction before depositing the dummy gate electrode layer over it. The dummy gate oxide layer can be formed by chemical vapor deposition or more preferably can be thermally grown. The dummy gate oxide layer is preferably formed to a thickness of between about 2 nm and 30 nm. FIG. 2a also shows cross sections along plane AA' and BB' of 200a.

Figure 2B:
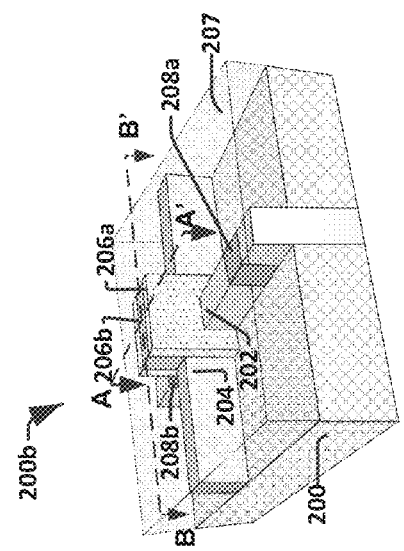

FIG. 2b illustrates a 3D view 200b of an embodiment of a finFET device comprising spacers 206a and 206b on either side of a dummy gate 204 and dopants diffused inside the fin. In some embodiments, the spacers 206a and 206b are preferably composed of silicon dioxide ($SiO_2$), silicon oxynitride ($Si_xO_yN_z$), composite ($SiO_2/Si_3N_4$), or most preferably silicon nitride ($Si_3N_4$). Impurity ions are implanted into the fin structure to form highly doped source region 208a and drain region 208b and lightly doped source and drain extensions (not shown). In some embodiments for an N-type device, the implanted ions can be As or P. A blanket dielectric layer 207 is formed entirely over substrate structure. Cross sections along plane AA' and BB' of 200b are also shown.

Figure 2C:
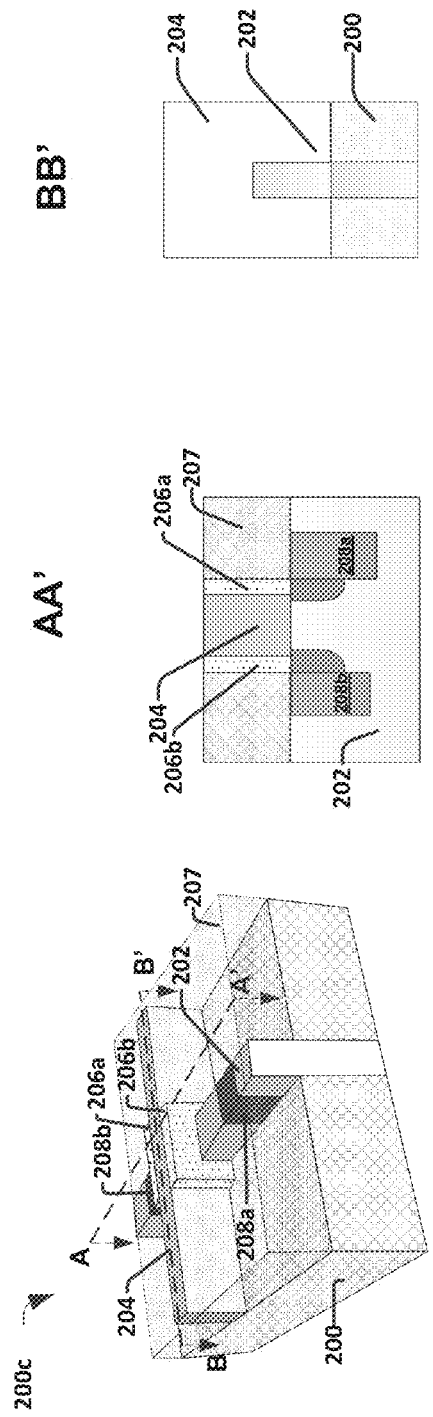

FIG. 2c illustrates a 3D view 200c of an embodiment of a finFET device after a planarizing step. Here, the blanket dielectric layer 207 the dummy gate 204, and the spacers 206a and 206b are planarized using a chemical mechanical polishing (CMP) process. Cross sections along plane AA' and BB' of 200c are also illustrated.

It is duly specified that from the next image onwards, the blanket dielectric layer 207 is not shown in the 3D images to provide clarity to other features.

Figure 2D:
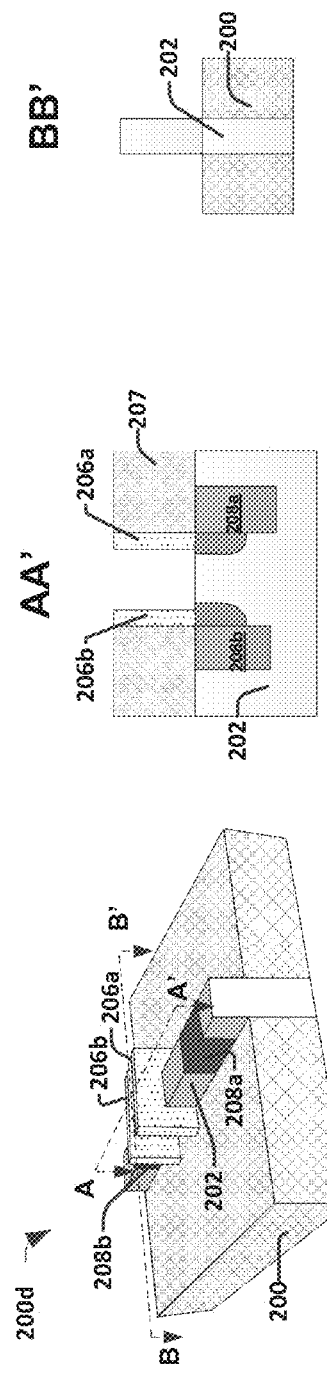

FIG. 2d illustrates a 3D view 200d of an embodiment of a finFET device wherein the dummy gate 204 has been removed leaving a gate opening. In some embodiments, the dummy gate 204 is removed using a selective etch such as a plasma etch using chlorine as a reactant to etch the polysilicon of the dummy gate electrode 204 selectively to the silicon dioxide of the blanket dielectric layer 207. The dummy gate oxide (not shown) can be removed in-situ using a $CHF_3/CF_4$ etch chemistry, thereby exposing the substrate structure in the gate opening. Cross sections along plane AA' and BB' of 200d are also shown.

FIG. 2e illustrates a 3D view 200e of an embodiment of a finFET device after depositing a strain-inducing layer or cap layer 210 in the gate opening. In some embodiments, the strain-inducing layer comprises SiGe. In this figure, spacer 206a is made transparent to get a clear view of the strain inducing layer 210 over the channel. Cross sections along plane AA' and BB' of 200e are also shown.

FIG. 2f illustrates a 3D view 200f of an embodiment of a finFET device after the deposition of a gate stack 212 over the strain inducing layer 210 in the gate opening. In some embodiments, the gate stack 212 comprises an interfacial layer, a high-k dielectric layer and a gate electrode. Here again, spacer 206a is made transparent to get a clear view of the gate stack 212 and the strain inducing layer 210. Also, cross sections along plane AA' and BB' of 200e are also shown.

Accordingly, as the strain-inducing layer 210 is deposited after the elevated temperature processes or after removing the dummy gate 204 in the RPG process, better carrier confinement and doping flexibility is achieved. Forming the gate stack 212 comprising the metal gate after the high temperature processes, prevents metal migration.

Figure 3:
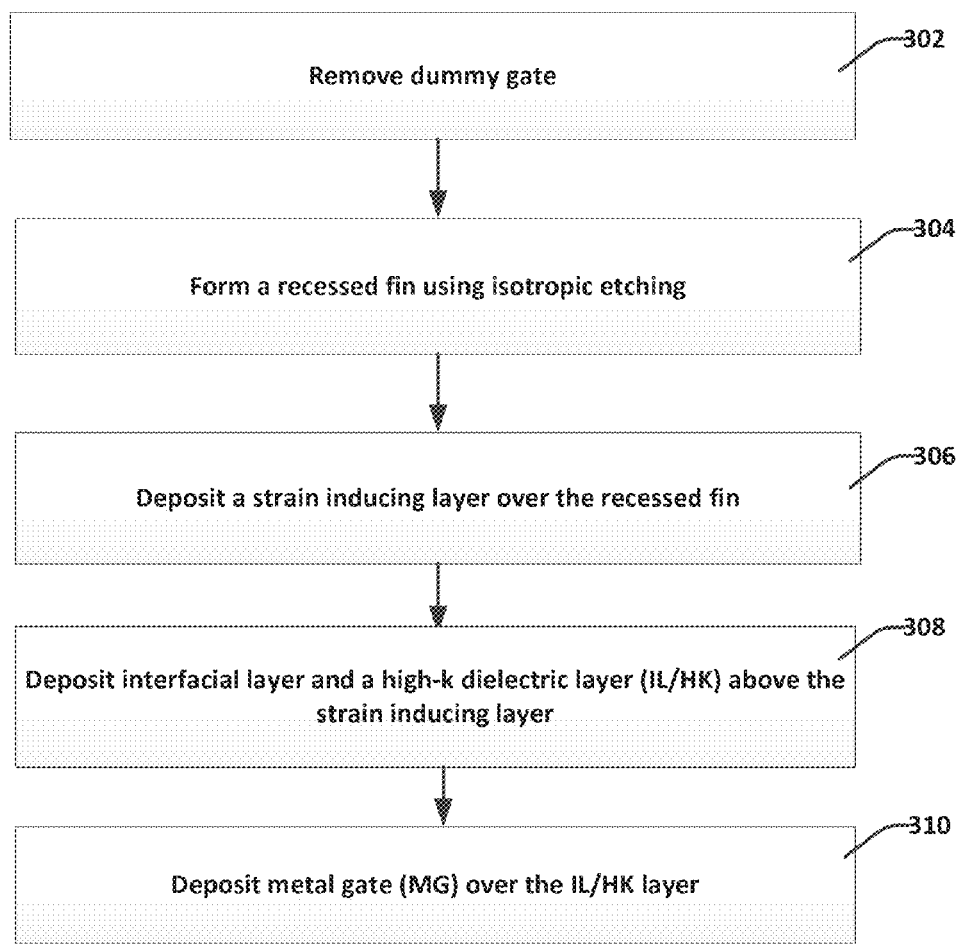
FIG. 3 illustrates a flow diagram of some embodiments of a method for forming a strain-inducing layer over a recessed fin of a finFET device.

FIG. 3 illustrates a flow diagram of some embodiments of a method 300 for forming a strain-inducing layer over a recessed fin of a finFET device. Method 300 corresponds to step 110b of method 100 in the RPG stage process flow.

At 302, a dummy gate is removed forming a gate opening.

At 304, semiconductor fin in the gate region is recessed using isotropic etching. A recessed fin provides effective stress to the fin channel and enhances device performance. In some embodiments, the recess may be etched using suitable etching technology such as dry etching, plasma etching, wet etching, etc. In another embodiment, one or more photolithography processes are used to form masking elements such that the remaining regions of the substrate are protected from the etching process.

At 306, a strain inducing layer is formed over the recessed fin in the gate opening.

At 308, an interfacial layer (IL) and a high-k dielectric layer (HK) are deposited above the strain inducing or capping layer.

At 310, a metal gate (MG) is deposited over the high-k dielectric layer forming a gate electrode.

Figure 4A:
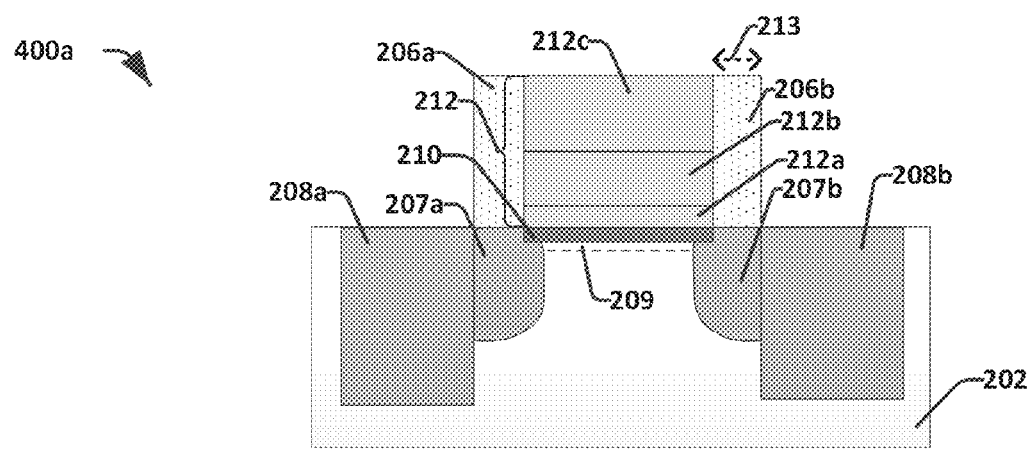
FIGS. 4a and 4b illustrate cross sectional images along two perpendicular planes of a finFET device comprising a strain-inducing layer over a recessed fin.
Figure 4B:
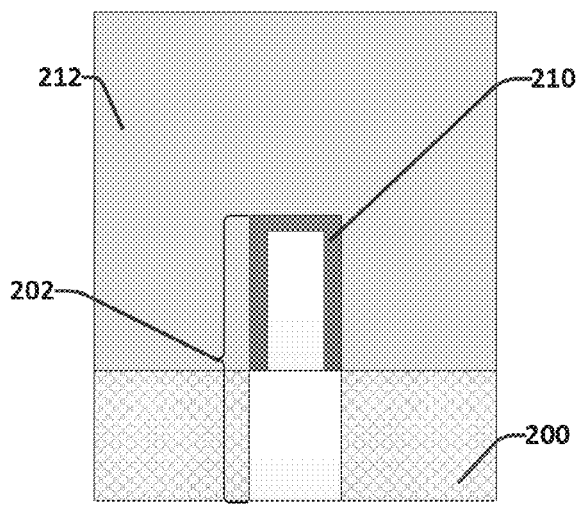

FIGS. 4a and 4b illustrate cross sectional images along two perpendicular planes of a finFET device comprising a strain-inducing layer over a recessed fin.

It is duly specified that, in all the following cross sectional images, the blanket dielectric layer 207 is not shown for clarity and simplicity.

FIG. 4a illustrates a cross sectional image 400a of a finfet device formed according to method 300. The cross section is along a plane which is parallel to the fin 202 and passes through the center of it (e.g. plane A-A' in FIG. 2f). Semiconductor fin 202 is recessed in the gate region making the strain inducing layer 210 reside above and close to channel 209 but below the level of a bottom surface of side wall spacers 206a and 206b. A gate stack 212 resides above the strain inducing layer 210. The gate stack comprises an interfacial layer 212a, a high-k dielectric layer 212b above the interfacial layer 212a and a gate metal 212c above the high-k dielectric layer 212c. In some embodiments spacers 206a and 206b may be doped or undoped. Doping the spacers would reduce the dielectric constant of gate spacers, and hence reduce the external resistance between the source and the drain regions. In some embodiments, the side wall spacers are subjected to dopants like Boron [B] at a concentration ranging from approximately 1e20 cm$^{-3}$ to 1e22 cm$^{-3}$. The width 213 of the spacers 206a and 206b range from approximately 1 nm to 5 nm. Within the fin, lightly doped source and drain (LDD) regions 207a and 207b or highly doped source and drain extensions 208a and 208b are present.

FIG. 4b illustrates 400b, which is a cross sectional image along a plane which is perpendicular to the fin 202 and which passes through the center of the gate stack 212. The strain inducing layer 210 is seen to reside within the width of the fin 202. Over the semiconductor body 200, enveloping the capping layer 210, resides the gate stack 212 which comprises an interfacial layer 212a, a high-k dielectric layer 212b and a gate metal 212c.

Figure 5:
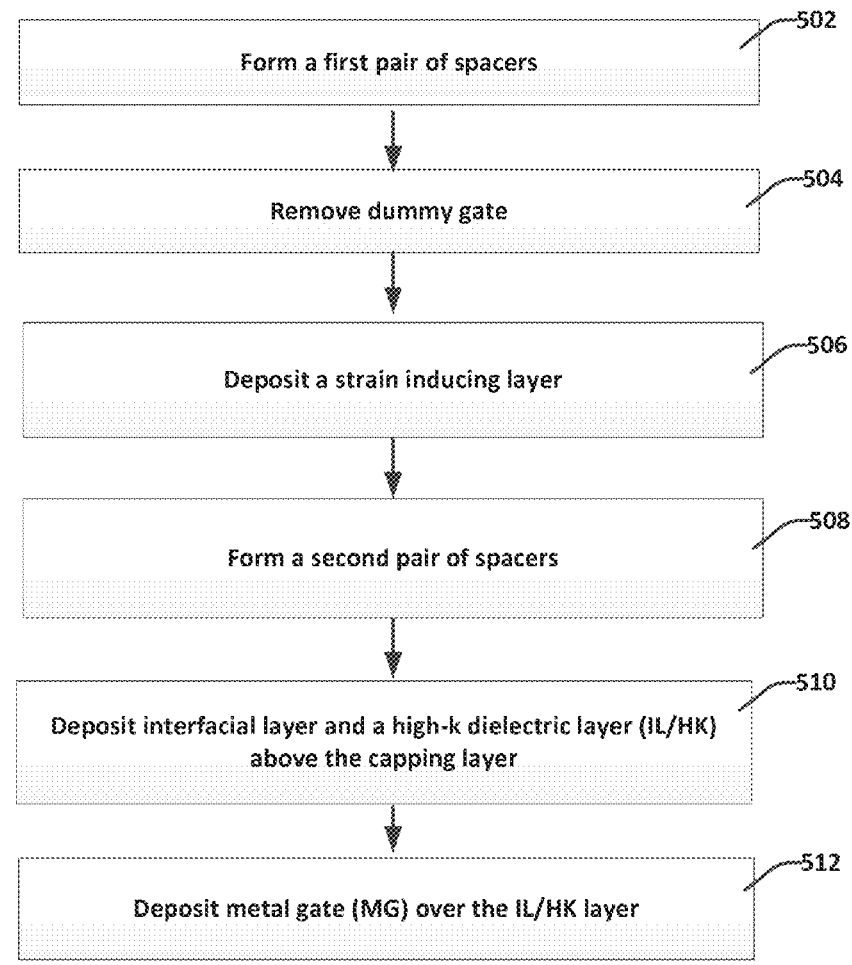
FIG. 5 illustrates a flow diagram of some embodiments of a method comprising forming a pair of spacers after the formation of a strain-inducing layer.

FIG. 5 illustrates a flow diagram of some embodiments of a method 500 comprising forming a pair of spacers after the formation of a strain inducing layer.

At 502, a first pair of spacers is formed on either side of a dummy gate. In some embodiments, the spacers are preferably composed of silicon dioxide (SiO$_2$), silicon oxynitride (Si$_x$O$_y$N$_z$), composite (SiO$_2$/Si$_3$N$_4$), or most preferably silicon nitride (Si$_3$N$_4$). They can be formed by a blanket deposition and isotropic etch back. The spacers preferably have a thickness of between about 1 nm and 5 nm.

At 504, the dummy gate is removed.

At 506, a strain inducing layer is formed over the fin in the gate opening.

At 508, a second pair of spacers is formed over the strain inducing layer vertically above the LDD regions (overlapped by the strain inducing layer) in order to reduce capacitive coupling between the LDD regions and the gate electrode.

At 510, an interfacial layer (IL) and a high-k dielectric layer (HK) are deposited above the strain inducing or capping layer.

At 512, a metal gate (MG) is deposited over the high-k dielectric layer forming a gate electrode.

Figure 6A:
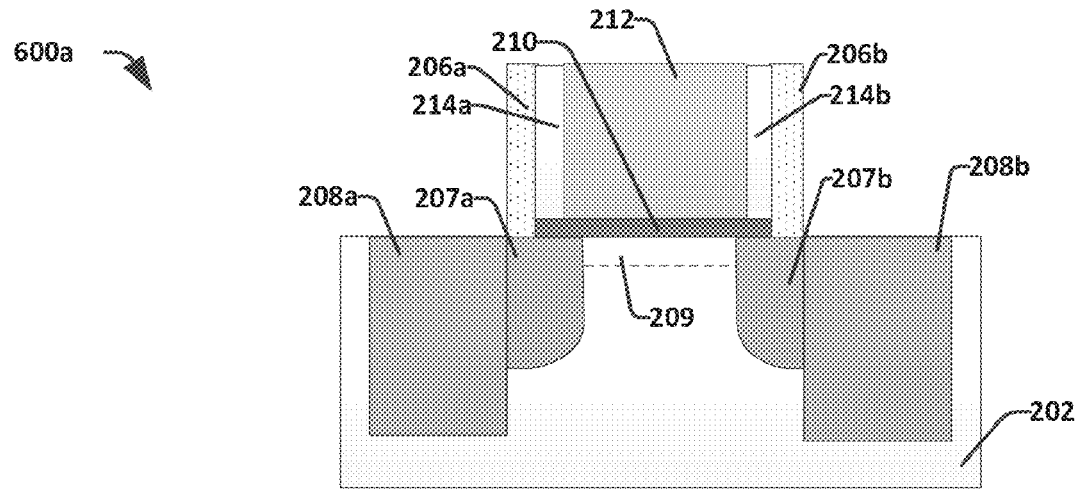
FIGS. 6a and 6b illustrate cross sectional images along two perpendicular planes of a finFET device comprising a strain-inducing layer and second pair of spacers.
Figure 6B:
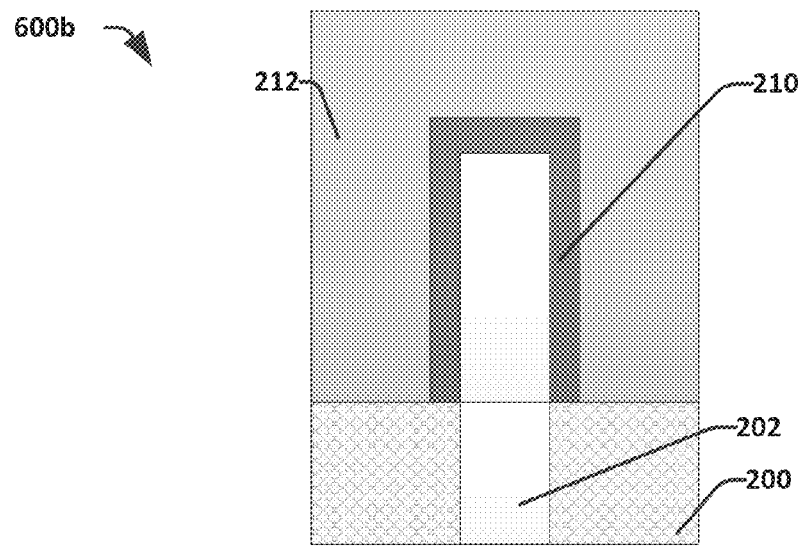

FIGS. 6a and 6b illustrate cross sectional images along two perpendicular planes of a finFET device comprising a strain inducing layer and second pair of spacers.

FIG. 6a illustrates 600a, which is a cross sectional image of a finFET device formed according to method 500. The cross section is along a plane which is parallel to the fin 202 and passes through the center of it. Semiconductor fin 202 comprises LDD regions 207a and 207b, source region 208a, drain region 208b and a carrier channel 209 disposed within the fin. Strain inducing layer 210 resides above the channel 209 and part of the LDD regions. A first pair of spacers 206a and 206b reside on either side of the cap layer above the distal ends of the LDD regions 207a and 207b. A second pair of spacers 214a and 214b reside above the strain inducing layer 210 at two end locations vertically above the LDD regions that are overlapped by the strain inducing layer. This is to reduce capacitive coupling between the LDD regions and the gate electrode. A gate stack 212 resides above the strain inducing layer 210 within the second pair of spacers 214a and 214b. In some embodiments, spacers 206a, 206b are undoped and spacers 214a and 214b are doped. Doping the spacers would reduce the dielectric constant of gate spacers, and hence reduce the external resistance between the source and the drain regions. In some embodiments, the second pair of spacers 214a and 214b is subjected to dopants like Boron [B] at a concentration ranging between approximately 1e20 cm$^{-3}$ to 1e22 cm$^{-3}$. The width of the spacers ranges from approximately 1 to 5 nm.

FIG. 6b illustrates 600b, which is a cross sectional image along a plane which is perpendicular to the fin 202 and which passes through the center of the gate stack 212. In this case the strain inducing layer 210 resides outside the width of the fin 202 unlike the recessed fin case. Above the semiconductor body 200, resides the gate stack 212 which encompasses the strain inducing layer 210 and comprises an interfacial layer, a high-k dielectric layer and a gate metal.

Figure 7A:
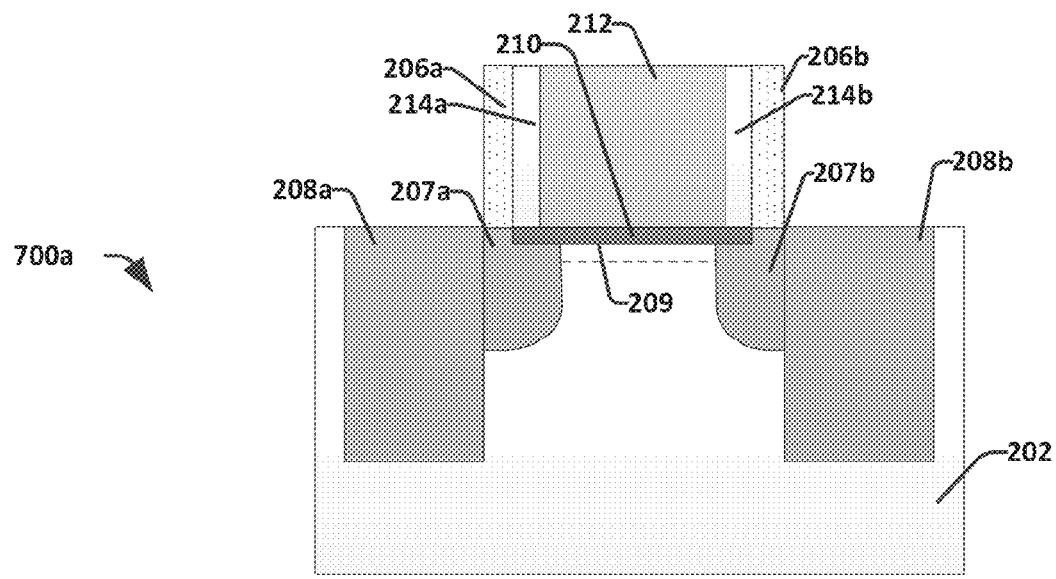
FIGS. 7a and 7b illustrate cross sectional images along two perpendicular planes of a finFET device comprising a strain-inducing layer over a recessed fin and, a second pair of spacers.

FIG. 7a illustrates an image 700a, which is a cross sectional image of a slightly different embodiment. The cross section is along a plane which is parallel to the fin 202 and passes through the center of it. In this embodiment, the device comprises two pairs of spacers similar to that illustrated in FIG. 6a, but they differ by the fact that 700a has a recessed fin in the gate region. Hence, the strain inducing layer 210 resides below the level of the bottom surface of all the spacers. The rest of the features are similar to that illustrated in FIG. 6a.

Figure 7B:
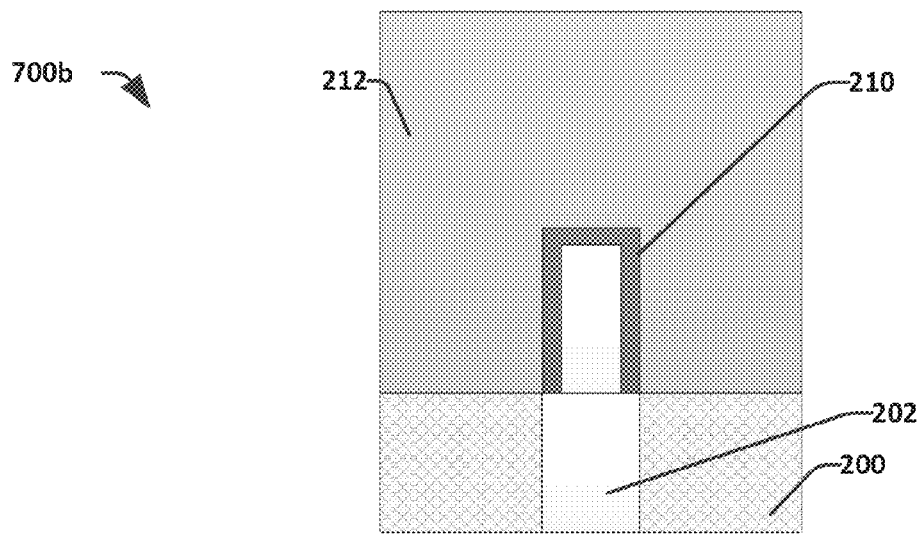

FIG. 7b illustrates a cross sectional image 700b which is a cross section along a plane perpendicular to the fin 202. Even though this embodiment illustrates a case with two pairs of spacers and a recessed fin, the cross section along this plane perpendicular to the fin 202, looks exactly the same as that illustrated in FIG. 4b.

Figure 8:
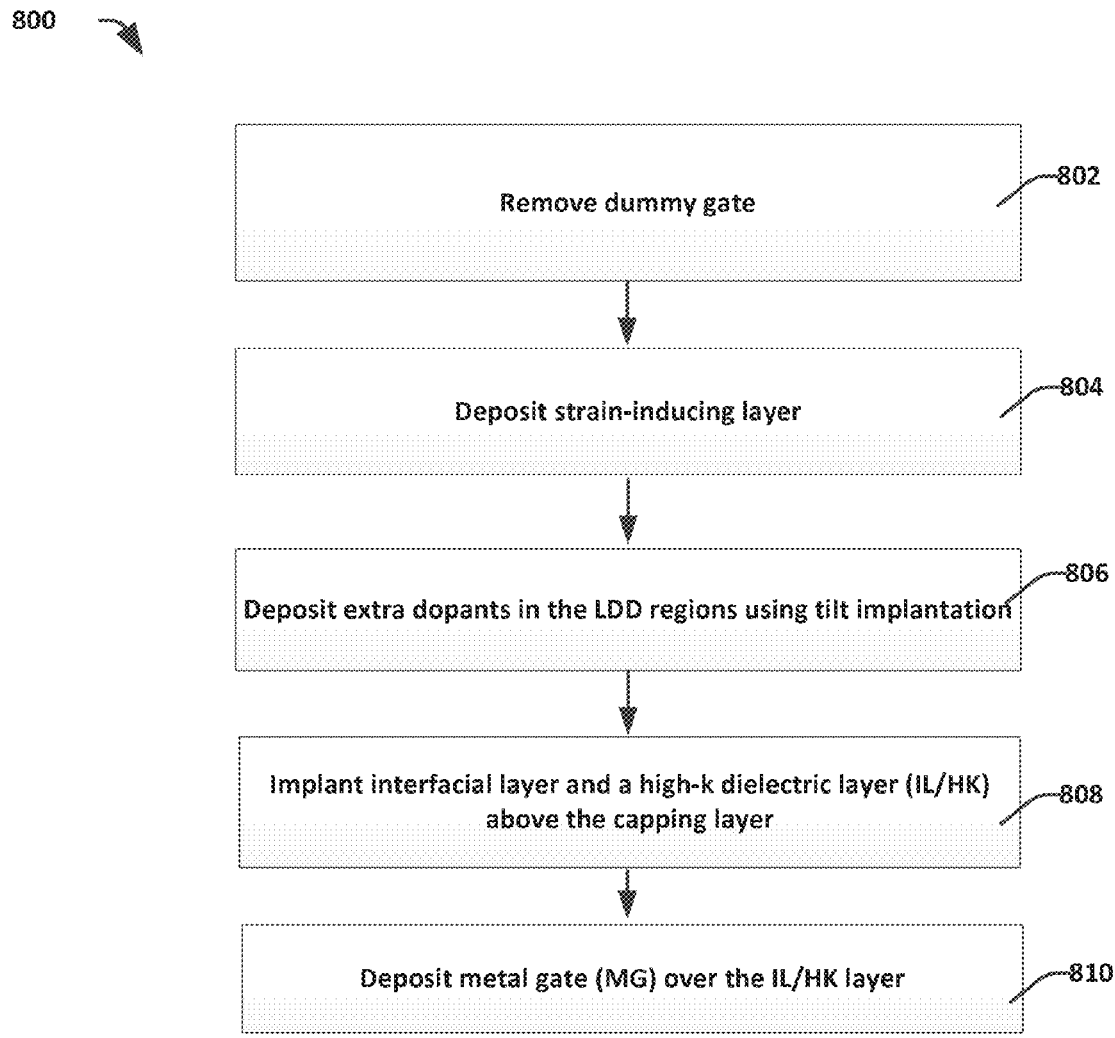
FIG. 8 illustrates a flow diagram of some embodiments of a method comprising tilt implantation in the LDD regions after formation of a strain-inducing layer.

FIG. 8 illustrates a flow diagram of some embodiments of a method 800 comprising tilt implantation in the LDD regions after formation of a strain inducing layer.

At 802, the dummy gate is removed leaving a gate opening. This step corresponds to step 110b of method 100.

At 804, a strain-inducing layer is formed over the fin in the gate opening.

At 806, extra dopants are implanted in the LDD regions using tilt implantation. Thermal processes taking place after formation of the source, drain and LDD regions tend to affect the dopant concentration in those regions, especially the lightly doped source and drain regions. This will affect the coupling between the gate and the channel established by the source and the drain regions or increase the source drain resistance. Tilt implantation in the LDD regions during the RPG stage, after formation of the strain inducing layer will help decrease the source drain resistance or external resistance. Thus, the extra dopants will help enhance device performance.

At 808, an interfacial layer (IL) and a high-k dielectric layer (HK) are deposited above the strain inducing or capping layer.

At 810, a metal gate (MG) is deposited over the high-k dielectric layer forming a gate electrode.

Figure 9:
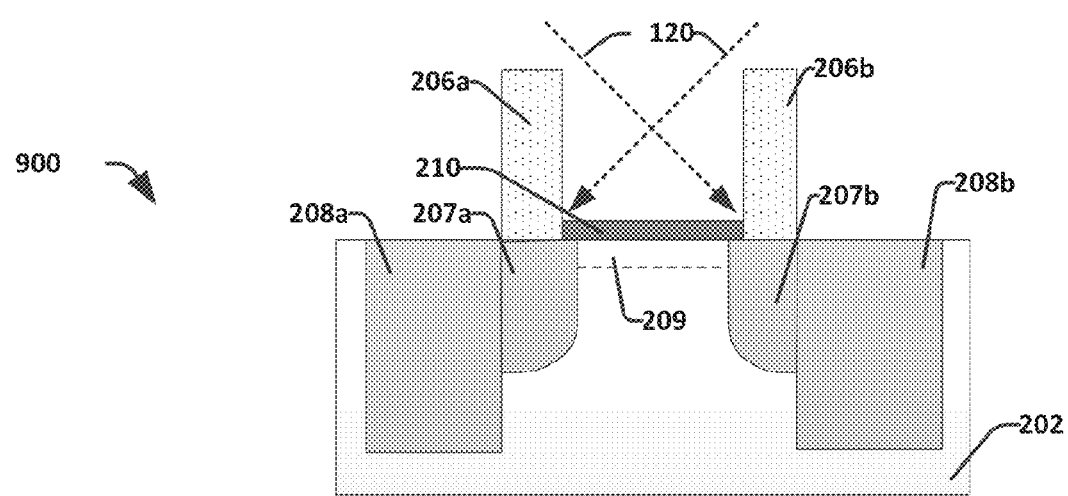
FIG. 9 illustrate a cross sectional image of a finFET device with an open gate region during tilt implantation.

FIG. 9 illustrates a cross sectional image 900 of a device formed according to method 800. The cross section is along a plane which is parallel to the fin 202. Dopant ions 120 are implanted in a tilted angle directing toward the LDD regions 207a and 207b. In some embodiments, dopants like boron [B] or difluroboron [BF2] at doses ranging between 1e14-2e15 cm$^{-2}$ are implanted in the LDD regions. The tilt angle and the energy of the implant ranges between T3-T45 and 0.5 KeV-10 KeV respectively. Source region 208a, drain region 208b and the carrier channel 209 are disposed within the semiconductor fin 202. The strain inducing layer 210 resides above the channel 209 in the gate region. Side wall spacers 206a and 206b resides on either side of the strain inducing layer 210 above the LDD regions 207a and 207b. The spacers 206a and 206b may be doped or undoped.

Figure 10:
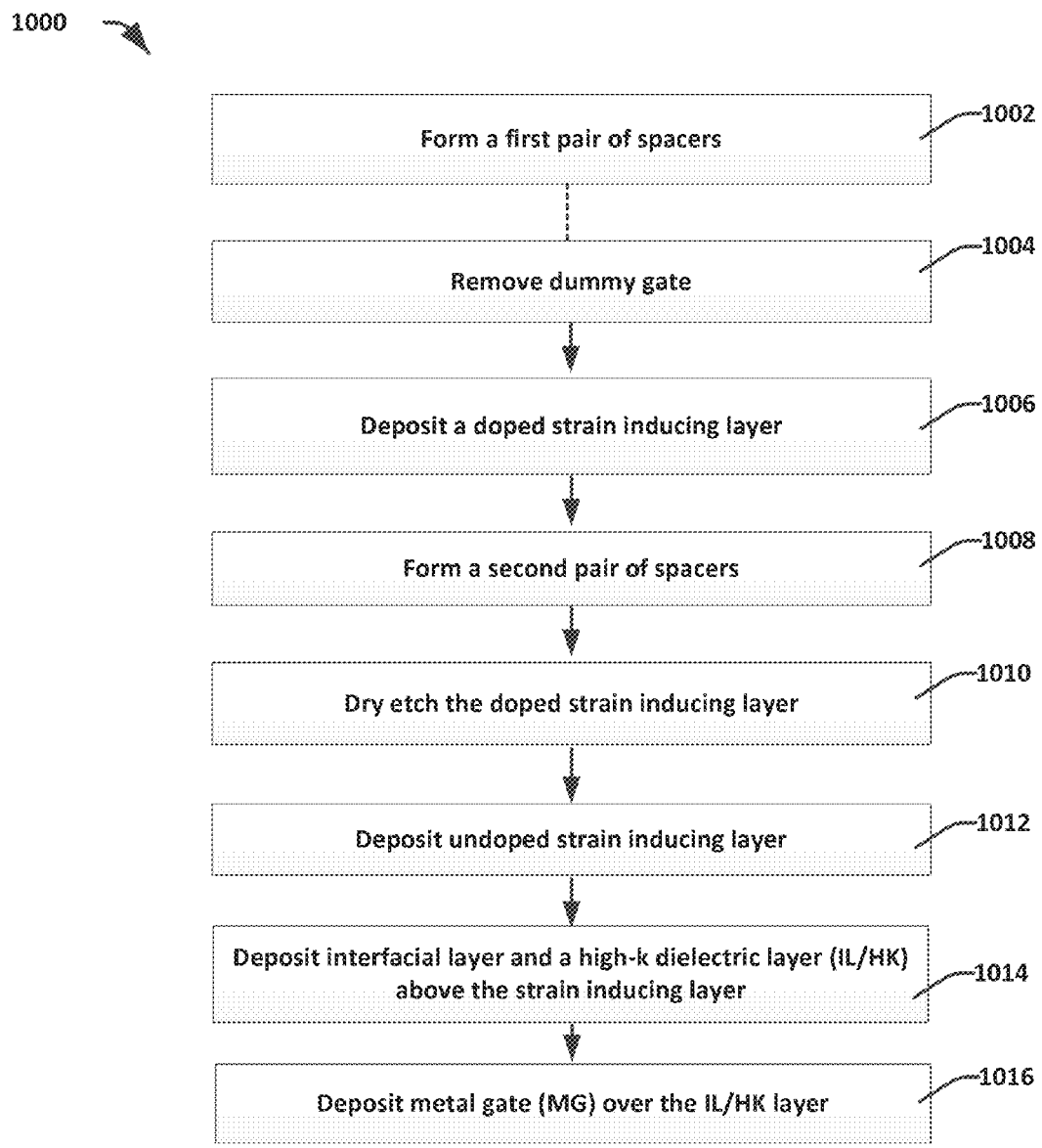
FIG. 10 illustrates a flow diagram of some embodiments of a method of forming a dual capping layer comprising a doped low resistance layer and an undoped strain-inducing layer.

FIG. 10 illustrates a flow diagram of some embodiments of a method 1000 for forming a dual capping layer comprising a doped strain inducing layer and an undoped strain-inducing layer.

At 1002, a first pair of spacers is formed on either side of a dummy gate.

At 1004, the dummy gate is removed forming a gate opening.

At 1006, a doped strain inducing layer is deposited in the gate opening. In some embodiments, the doped strain inducing layer comprises [B] dopant concentration ranging from 1e18 cm$^{-3}$-5e21 cm$^{-3}$. The thickness of the doped strain inducing layer ranges from approximately 1 nm-10 nm. The doped strain inducing layer above the LDD regions helps reduce the source drain external resistance.

At 1008, a second pair of spacers is formed above the doped strain inducing layer vertically above the LDD regions.

At 1010, the doped strain inducing layer is removed from the gate opening. In some embodiments this is done using dry etching or plasma etching.

At 1012, an undoped strain inducing layer is deposited in the gate opening. In some embodiments, the thickness of the undoped strain inducing layer ranges from approximately 1 nm-10 nm.

At 1108, an interfacial layer (IL) and a high-k dielectric layer (HK) are deposited above the undoped strain inducing layer.

At 1110, a metal gate (MG) is deposited over the high-k dielectric layer forming a gate electrode.

Figure 11:
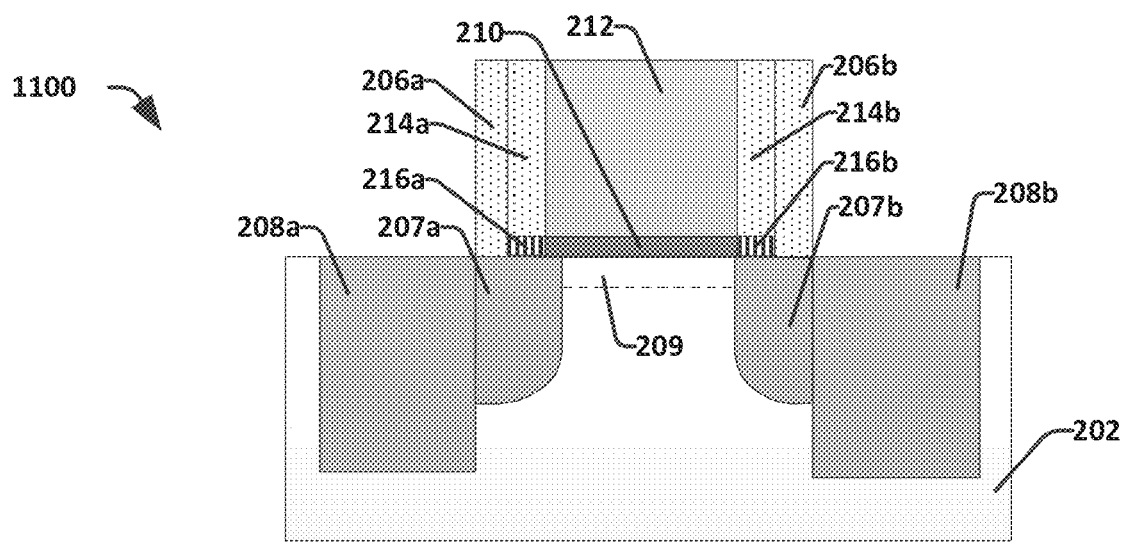
FIG. 11 illustrate a cross sectional image of a finFET device comprising a doped low resistance layer and an undoped strain-inducing layer.

FIG. 11 illustrates an image 1100, which is a cross section along a plane parallel to the fin of a device, formed according to method 1000. Doped strain inducing regions 216a and 216b are seen under the second pair of spacers 214a and 214b. In this embodiment, both the first and second pairs of spacers are undoped. The rest of the features are the same as that illustrated in FIG. 6a.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein The present disclosure relates to a method of forming a strain inducing layer or cap layer at the RPG stage of a finFET device formation process. This will prevent relaxation of the strain inducing layer because by this stage, the high temperature processes that cause the relaxation would be completed. Different types of doping techniques that helps in reducing the external resistance are also discussed in this disclosure.

In some embodiments, the present disclosure relates to a method of forming a strain inducing layer overlaying a channel in a finFET (fin field-effect transistor) device, comprising, forming a dummy gate over a channel in a fin of the finFET device, removing the dummy gate during a replacement polysilicon gate (RPG) stage and depositing a strain inducing layer over the channel, after removing the dummy gate.

In another embodiment, the present disclosure relates to a method of forming a SiGe (silicon germanium) strain inducing layer overlaying a channel in a finFET (fin field-effect transistor) device, comprising, forming a dummy gate comprising silicon dioxide or a polymer, forming a first pair of spacers on either side of the dummy gate, forming source/drain (S/D) and lightly doped drain (LDD) regions within a fin of the finFET device, removing the dummy gate leaving a gate opening, depositing a SiGe strain inducing layer over a channel region within the fin, depositing an interfacial layer and a high-k dielectric layer above the SiGe strain inducing layer; and, depositing a gate metal above the high-k dielectric layer.

In yet another embodiment, the present disclosure relates to a fin field-effect transistor (finFET) device comprising, a semiconductor fin above a semiconductor substrate, a source and a drain region within the semiconductor fin, lightly doped regions (LDD) within the semiconductor fin, that abuts side walls of the source and the drain regions that face each other, a carrier channel that connects the two LDD regions, a strain inducing layer over a top surface of the carrier channel, one or more pairs of spacers above the LDD regions, and a gate stack abutting a top surface of the strain inducing layer.

What is claimed is:

1. A method of forming a strain inducing layer overlaying a channel in a finFET (fin field-effect transistor) device, comprising:
    forming a dummy gate over an upper surface of a fin of semiconductor material and along sidewalls of the fin, wherein the fin corresponds to channel region of the finFET device;
    forming source/drain regions for the finFET device on opposite edges of the dummy gate while the dummy gate is in place over the channel region;
    removing the dummy gate after the source/drain regions have been formed and leaving a remaining portion of fin in place after the dummy gate has been removed; and
    forming a strain inducing layer over an upper surface of the remaining portion of the fin and along sidewalls of the remaining portion of the fin.

2. The method of claim 1, further comprising:
    depositing a high-k dielectric layer over the strain inducing layer; and
    depositing a metal gate electrode over the high-k dielectric layer.

3. The method of claim 2, further comprising forming a first pair of spacers on opposing sides of the dummy gate.

4. The method of claim 3 further comprising, forming a second pair of spacers along inner sidewalls of the first pair of spacers.

5. The method of claim 1, wherein the strain inducing layer comprises silicon germanium (SiGe).

6. The method of claim 1 further comprising: forming a recess in the channel region of the finFET device before depositing the strain inducing layer.

7. The method of claim 1 further comprising, forming lightly doped LDD regions using tilt implantation, after depositing the strain inducing layer.

8. The method of claim 1, further comprising, forming a pair of doped spacers before or after the formation of the strain inducing layer.

9. The method of claim 1, further comprising, forming dual strain inducing layers comprising, doped strain inducing layers at corners of the dummy gate, and undoped strain inducing layer between the doped strain inducing layers.

10. The method of claim 1, further comprising:
    forming a first pair of spacers on outer sidewalls of the dummy gate;
    removing the dummy gate to leave a gate opening between the first pair of spacers;
    forming a second pair of spacers along inner sidewalls of the first pair of spacers and over peripheral regions of the strain inducing layer, wherein the second pair of spacers leave a central region of the strain inducing layer exposed;
    with the second pair of spacers in place, removing the central region of the strain inducing layer to form an opening between the peripheral regions of the strain inducing layer; and
    forming a second strain inducing layer in the opening between the peripheral regions of the strain inducing layer.

11. A method of forming a SiGe (silicon germanium) strain inducing layer overlaying a channel region in a finFET (fin field-effect transistor) device, comprising:
    forming a dummy gate comprising silicon dioxide or a polymer over a fin of semiconductor material;
    forming a first pair of spacers on opposite sides of the dummy gate;
    forming source/drain (S/D) regions and lightly doped drain (LDD) regions proximate to the opposite sides of the dummy gate, wherein a channel region is arranged under the dummy gate in the fin;
    removing the dummy gate to leave a gate opening over the channel region and between inner sidewalls of the first pair of spacers;
    depositing the SiGe strain inducing layer in the gate opening;
    forming a second pair of spacers along the inner sidewalls of the first pair of spacers and over peripheral regions of the SiGe strain inducing layer, wherein the second pair of spacers leave a central region of the SiGe strain inducing layer exposed;
    depositing a high-k dielectric layer above the SiGe strain inducing layer; and
    depositing a metal gate electrode above the high-k dielectric layer.

12. The method of claim 11 further comprising:
    forming a recess in an upper surface of the fin before forming the SiGe strain inducing layer; wherein the SiGe strain inducing layer is deposited in the recess.

13. The method of claim 12, wherein the recess in the fin is formed by isotropically etching the fin by approximately 1 nm-10 nm.

14. The method of claim 12, wherein a width of the first and second pairs of spacers approximately ranges from 1 nm-5 nm.

15. The method of claim 11, further comprising:
    with the second pair of spacers in place, removing the central region of the SiGe strain inducing layer to form an opening; and
    forming a second strain inducing layer in the opening, wherein the high-k dielectric layer is formed over the second strain inducing layer.

16. The method of claim 15 comprising:
    wherein the first pair of spacers are doped before or after forming the SiGe strain inducing layer; and
    wherein the second strain inducing layer is an undoped SiGe strain inducing layer.

17. The method of claim 16, wherein a thickness of the SiGe strain inducing layer ranges from approximately 1 nm-10 nm.

18. A method of forming a strain inducing layer overlaying a channel region in a finFET (fin field-effect transistor) device, comprising:
    forming a dummy gate directly over an upper surface and along sidewalls of a fin of semiconductor material;
    forming a first pair of spacers on opposing sides of the dummy gate;
    forming source/drain (S/D) regions and lightly doped drain (LDD) regions proximate to the opposing sides of the dummy gate, wherein the fin includes a channel region arranged between the LDD regions and under the dummy gate;
    removing the dummy gate while leaving the first pair of spacers and a remaining portion of fin in place;
    forming a recess in an upper surface of the remaining portion of the fin;
    depositing a strain inducing layer in the recess over the upper surface of the remaining portion of the fin and along outer sidewalls of the remaining portion of the fin;

depositing a high-k dielectric layer above an upper surface of the strain inducing layer and along outer sidewalls of the strain inducing layer; and depositing a metal gate electrode above an upper surface of the high-k dielectric layer and along outer sidewalls of the high-k dielectric layer.

19. The method of claim 18 further comprising:

forming a second pair of spacers after forming the strain inducing layer; and performing an angled implantation to form the LDD regions after forming the second pair of spacers.

20. The method of claim 18, further comprising:

forming a second pair of spacers along inner sidewalls of the first pair of spacers and over peripheral regions of the strain inducing layer, wherein the second pair of spacers leave a central region of the strain inducing layer exposed;

with the second pair of spacers in place, removing the central region of the strain inducing layer to form an opening between the peripheral regions of the strain inducing layer; and forming a second strain inducing layer in the opening to between the peripheral regions of the strain inducing layer.

* * * * *